US006847051B2

(12) United States Patent
Hong

(10) Patent No.: US 6,847,051 B2
(45) Date of Patent: Jan. 25, 2005

(54) ELEVATED PHOTODIODE IN AN IMAGE SENSOR

(75) Inventor: Sungkwon Hong, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/443,891

(22) Filed: May 23, 2003

(65) Prior Publication Data

US 2004/0232456 A1 Nov. 25, 2004

(51) Int. Cl.[7] .............................................. H01L 29/04
(52) U.S. Cl. ...................... 257/59; 257/59; 257/72; 257/233; 257/257; 257/258; 257/290; 257/291; 257/292; 438/48; 438/128; 438/149; 438/151; 438/157
(58) Field of Search .......................... 257/59, 72, 233, 257/257, 258, 290, 291, 292; 438/48, 128, 149, 151, 157

(56) References Cited

U.S. PATENT DOCUMENTS

| | | | | |
|---|---|---|---|---|
| 5,625,210 A | * | 4/1997 | Lee et al. ................... 257/292 |
| 5,880,495 A | * | 3/1999 | Chen ........................... 257/233 |
| 5,977,561 A | * | 11/1999 | Wu ............................... 257/67 |
| 6,127,697 A | * | 10/2000 | Guidash ...................... 257/292 |
| 6,218,691 B1 | * | 4/2001 | Chung et al. ................ 257/290 |
| 6,570,201 B2 | * | 5/2003 | Shim ........................... 257/292 |
| 6,570,222 B2 | * | 5/2003 | Nozaki et al. .............. 257/347 |
| 6,617,623 B2 | * | 9/2003 | Rhodes ........................ 257/215 |
| 6,677,656 B2 | * | 1/2004 | François ..................... 257/462 |
| 6,686,220 B2 | * | 2/2004 | Rhodes et al. ................ 438/69 |
| 6,693,335 B2 | * | 2/2004 | Gonzalez et al. ........... 257/410 |

* cited by examiner

Primary Examiner—Allan R. Wilson
Assistant Examiner—Edgardo Ortiz
(74) Attorney, Agent, or Firm—Dickstein Shapiro Morin & Oshinsky LLP

(57) ABSTRACT

The invention provides an elevated photodiode for image sensors and methods of formation of the photodiode. Elevated photodiodes permit a decrease in size requirement for pixel sensor cells while reducing leakage, image lag and barrier problems typically associated with conventional photodiodes.

25 Claims, 17 Drawing Sheets

ELEVATED PHOTODIODE IN AN IMAGE SENSOR

FIELD OF INVENTION

The present invention relates generally to digital image sensors and methods of fabrication thereof and in particular to a pixel sensor cell having an elevated photodiode.

BACKGROUND

Typically, a digital imager array includes a focal plane array of pixel cells, each one of the cells including a photoconversion device, e.g. a photogate, photoconductor, or a photodiode. In a CMOS imager a readout circuit is connected to each pixel cell which typically includes a source follower output transistor. The photoconversion device converts photons to electrons which are typically transferred to a floating diffusion region connected to the gate of the source follower output transistor. A charge transfer device (e.g., transistor) can be included for transferring charge from the photoconversion device to the floating diffusion region. In addition, such imager cells typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing patents are hereby incorporated by reference in their entirety.

FIG. 1 illustrates a block diagram of an exemplary CMOS imager device 308 having a pixel array 200 with each pixel cell being constructed as described above. Pixel array 200 comprises a plurality of pixels arranged in a predetermined number of columns and rows (not shown). The pixels of each row in array 200 are all turned on at the same time by a row select line, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel. The CMOS imager is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$), are read by a sample and hold circuit 261 associated with the column device 260. A differential signal ($V_{rst}-V_{sig}$) is produced by differential amplifier 262 for each pixel which is digitized by analog to digital converter 275 (ADC). The analog to digital converter 275 supplies the digitized pixel signals to an image processor 280 which forms a digital image.

In a digital CMOS imager, when incident light strikes the surface of a photodiode, electron/hole pairs are generated in the p-n junction of the photodiode. The generated electrons are collected in the n-type region of the photodiode. The photo charge moves from the initial charge accumulation region to the floating diffusion region or it may be transferred to the floating diffusion region via a transfer transistor. The charge at the floating diffusion region is typically converted to a pixel output voltage by a source follower transistor (described above).

Conventional CMOS imagers typically have difficulty fully transferring the photogenerated charge from the photodiode to the floating diffusion region. One problem with transferring charge occurs if die n-type silicon layer of the photodiode is located close to the surface which causes a certain amount of electron/carrier recombination due to surface defects. Electron/carrier recombination needs to be reduced to achieve good charge transfer to the floating diffusion region. Another obstacle to complete charge transference are potential barriers which exist at the gate of a transfer transistor.

Digital imagers may utilize a pixel containing a p-n-p photodiode 49, an example of which is shown in FIG. 2. The pixel sensor cell shown in FIG. 2 has a p-type substrate 60 with a p-well 61. In the illustrated example, a p-type layer 10 of photodiode 49 is located closest to the surface of substrate 60 and an n-type layer 12 is buried between the p-type layers 10, 60. The p-n-p photodiode 49 has some drawbacks. First, there can be a lag problem with pixels having transfer transistors 18 for transferring charge to the floating diffusion region 14 because during the integration time the electron carriers are collected in the sandwiched n-layer 12 and then transferred to the floating diffusion region 14 through a transfer gate 18. In order to fully utilize the generated electron carrier it is necessary to eliminate two energy barriers to reach the floating diffusion region, between the photodiode and the transfer gate and between the transfer gate and floating diffusion region. Charge leakage is another problem associated with the conventional p-n-p photodiode 49. That is, when the transfer transistor 18 gate length is too short, sub-threshold current becomes significantly high due to charge breakdown between n-type layers of both sides of the transfer gate channel.

SUMMARY

The invention provides an elevated photodiode for image sensors and methods of formation of the photodiode. Elevated photodiodes allow a decrease in size requirements for pixel sensor cells while reducing leakage, image lag and barrier problems typically associated with conventional photodiodes.

Additional features of the present invention will be apparent from the following detailed description and drawings which illustrate exemplary embodiments of the invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device and associated transistors for converting photons to an electrical signal. For purposes of illustration, a single representative pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

Figure 3:
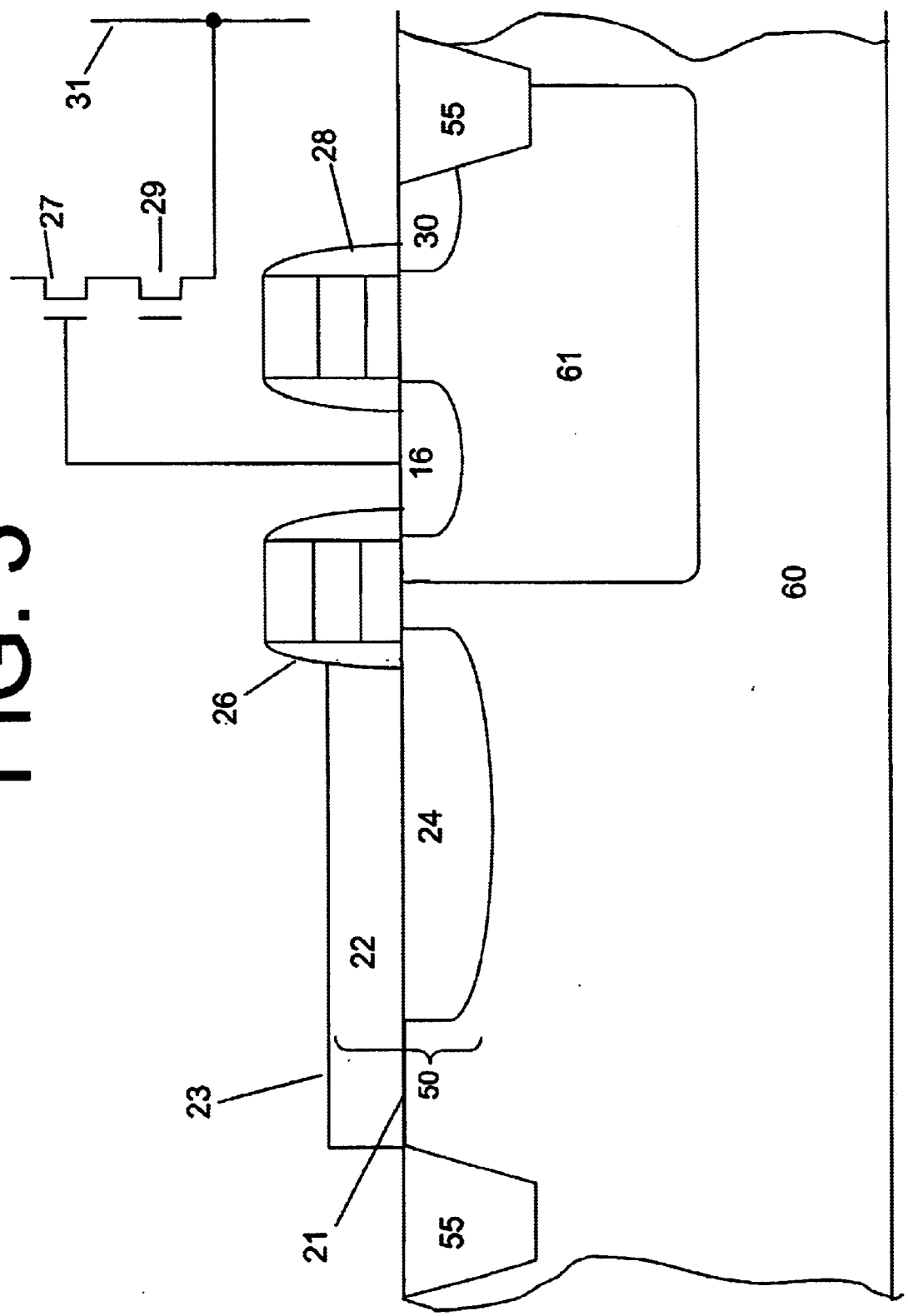
FIG. 3 is a cross-sectional view of an exemplary p-n-p photodiode constructed according to an embodiment of the invention.

In the following description, the invention is described in relation to a CMOS imager for convenience; however, the invention has wider applicability to any photodiode of any imager cell. Now referring to the figures, where like reference numbers designate like elements, FIG. 3 illustrates a pixel sensor cell constructed in accordance with a first exemplary embodiment of the invention. A photoconversion device 50 is formed in a substrate 60 having a surface 21 and having a doped layer or well 61, which for exemplary purposes is a p-type well. The photoconversion device is a photodiode and may be a p-n junction photodiode, a Schottky photodiode, or any other suitable photodiode, but for exemplary purposes is discussed as a p-n-p photodiode. In addition and for exemplary purposes only, substrate 60 is a p-type substrate and well 61 is a p-type well.

The exemplary p-n-p photodiode 50, as shown in FIG. 3, consists of a p+ region 22 and an n-type region 24, where only n-type region 24 is within p-well 60. The remaining structures shown in FIG. 3 include a transfer transistor with associated gate 26 and a reset transistor with associated gate 28. Floating diffusion region 16, source/drain region 30 and shallow trench isolation (STI) regions 55 are also shown. A source follower transistor 27 and row select transistor 29 with associated gates are also included in the pixel sensor cell but are not shown in the FIG. 3 cross-sectional view. They are instead depicted in FIG. 3 in electrical schematic form with the output of the row select transistor 29 being connected with a column line 31. Although shown in FIG. 3 as a 4-transistor (4T) configuration with a transfer transistor, the invention can also be utilized in a 3-transistor (3T) configuration, without a transfer transistor, and in pixels with other higher transistor number configurations.

As shown in FIG. 3, substrate 60 has a first surface level 21 and p-type region 22 is located at a second, higher level having a second surface 23, on top of the first surface level 21 of the substrate 60. Due to the elevated position of the p+ region 22, the n-type region 24 is also elevated and may be located directly below the top of the surface of the p-type substrate 60. The n-type region 24 acts as a source for the transfer gate 26. The n-type region 24 is at the same depth as the floating diffusion region 16 and/or a drain of an adjacent transistor. The location of the p-type region 22 on the surface above the n-type region 24 minimizes surface recombination of electron carriers. The advantages of this arrangement include minimized leakage from the n-type region and decreased energy barriers and lag problems.

FIGS. 4–12 show one exemplary method of forming a pixel sensor cell with an elevated photodiode of the present invention at various stages of formation. For convenience, the same cross-sectional view of FIG. 3 is utilized in FIGS. 4–12 for the ensuing description, so the source follower and row select transistors are not illustrated.

Figure 4:
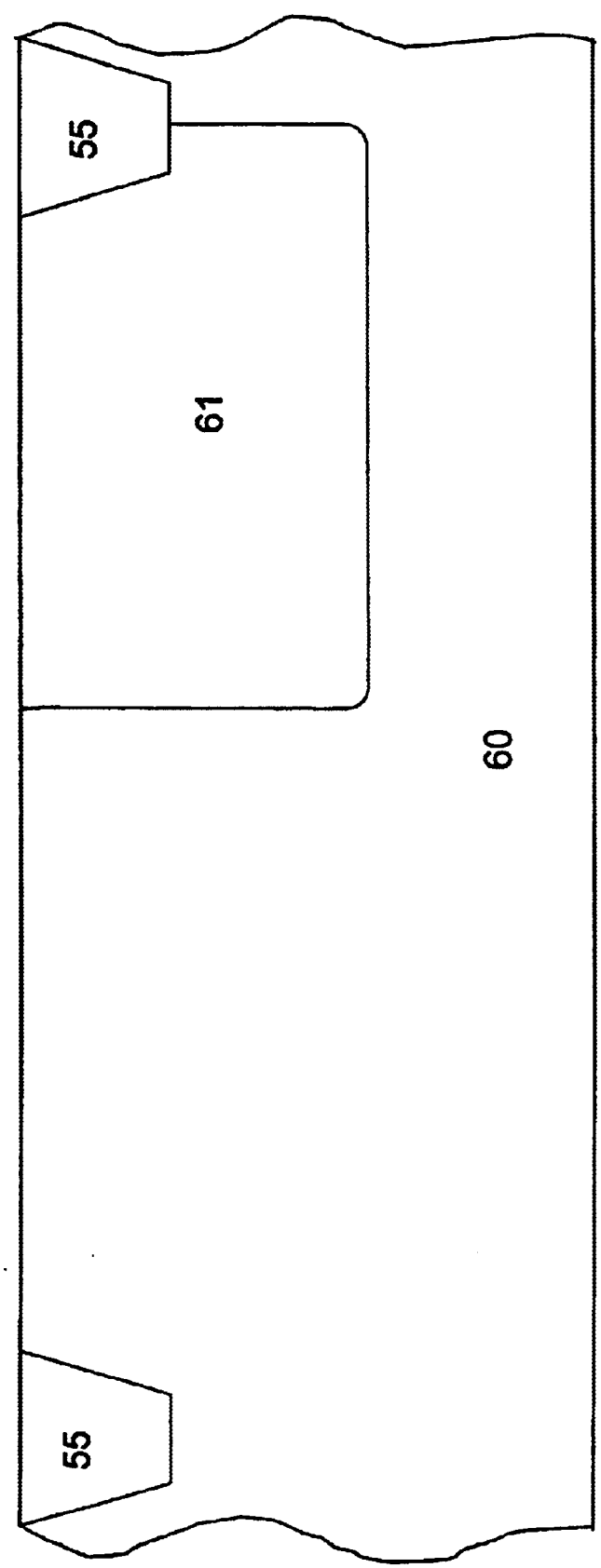
FIG. 4 shows a cross-sectional view of a portion of the FIG. 3 photodiode during a stage of processing performed in accordance with an embodiment of the invention.

Referring to FIG. 4, first a substrate 60 is provided. This substrate 60 is a p-type silicon substrate with a separate p-well 61 formed therein. The p-type well 61 may be formed before or after the formation of isolation regions 55. The p-well implant may be conducted so that the pixel array well 61 and a p-type periphery logic well, which will contain logic circuits for controlling the pixel array, have different doping profiles. As known in the art, multiple high energy implants may be used to tailor the profile and position of the p-type well 61.

Isolation regions 55 are formed to electrically isolate regions of the substrate where pixel cells will later be formed. The isolation regions 55, can be formed by any known technique such as thermal oxidation of the underlying silicon in a LOCOS process, or by etching trenches and filling them with oxide in an STI (shallow trench isolation) process. Following formation of isolation regions 55 if the p-type well 61 has not yet been formed, it may then be formed by blanket implantation or by masked implantation to produce the p-type well 61.

Figure 5:
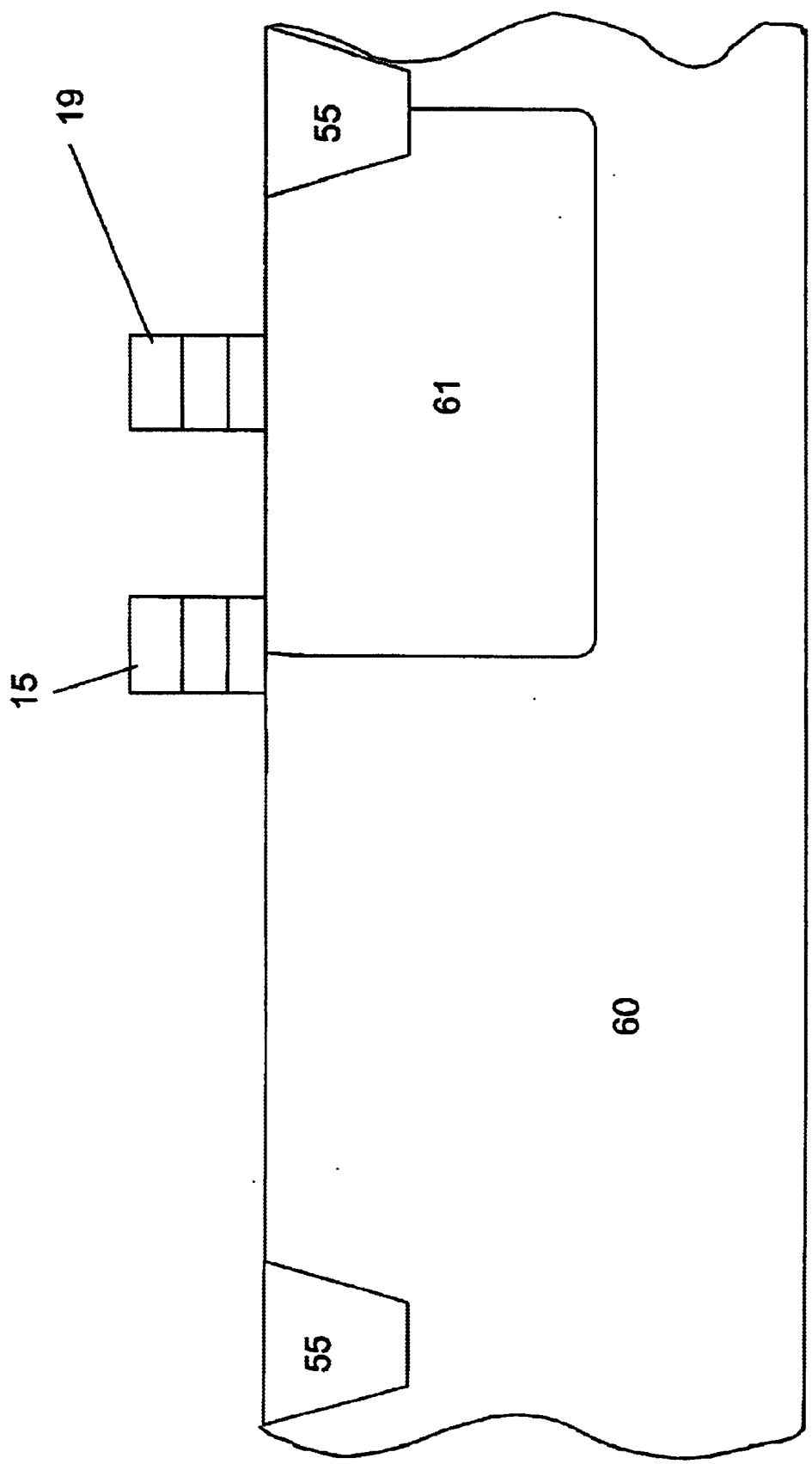
FIG. 5 shows a stage of processing subsequent to that shown in FIG. 4.

Next the a transfer gate stack 15, and reset gate stack 19 are formed by well-known methods, e.g., blanket deposition of gate oxide, doped polysilicon, deposition of metal for a silicide, deposition of nitride cap layer and annealing to form a silicide, then patterning and etching. The invention is not limited to a particular method of forming transistor gate stacks 15, 19. FIG. 5 shows an exemplary embodiment of a pixel with formed gate stacks 15, 19 for a transfer transistor and a reset transistor, respectively. Although shown in this embodiment having a transfer transistor in a 4T configuration, the invention can also be used in a 3T configuration having a reset transistor, source follower transistor and row select transistor, without the transfer transistor gate stack 15 shown in FIG. 5.

Figure 6:
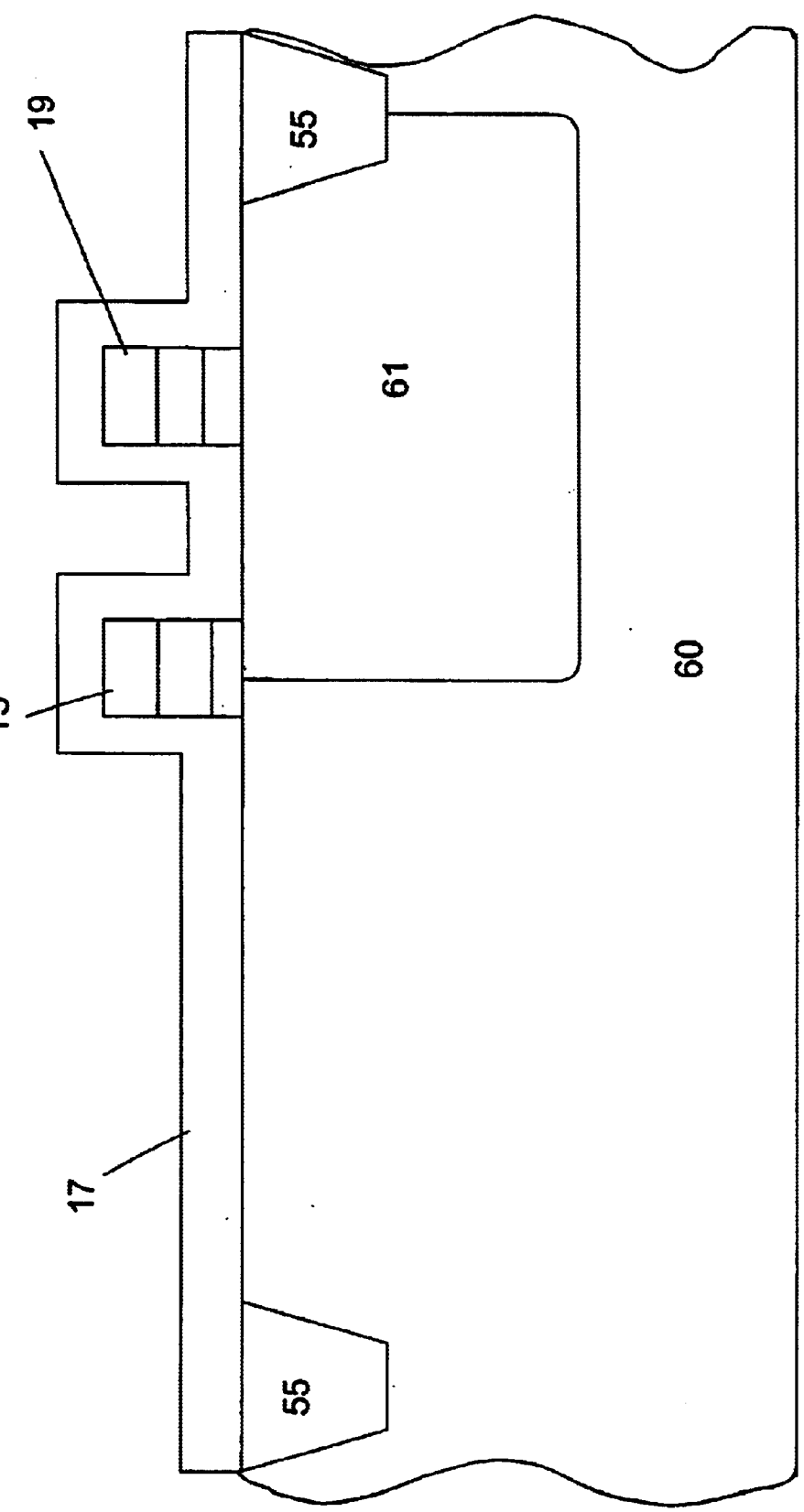
FIG. 6 shows a stage of processing subsequent to that shown in FIG. 5.
Figure 7:
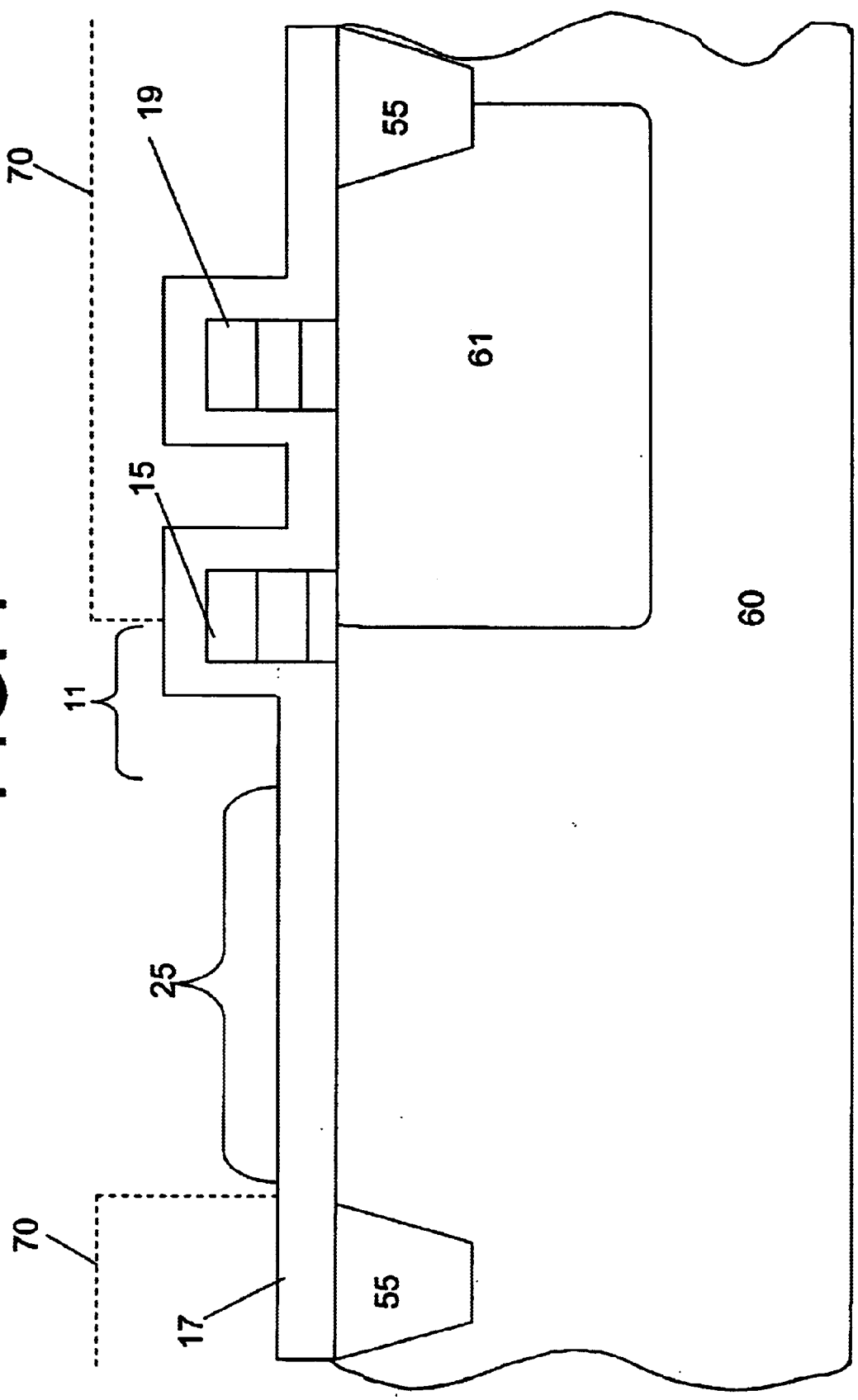
FIG. 7 shows a stage of processing subsequent to that shown in FIG. 6.

FIG. 6 shows deposition of a silicon dioxide ($SiO_2$) blocking layer 17 over the wafer. Photolithography is used to open an area 25 where the photodiode will be located aid an area 11 on the side of the transfer gate closest to photodiode area 25, as depicted in FIG. 7. The $SiO_2$ blocking layer 17 is then only left covering the gate stacks 15, 19 and areas between the gate stacks 15, 19 where source/drain regions will later be implanted. After the photolithography step, a photo resist layer 70 is provided over the wafer with exception of the area 11 on the side of the transfer gate closest to photodiode area 25.

Figure 8:
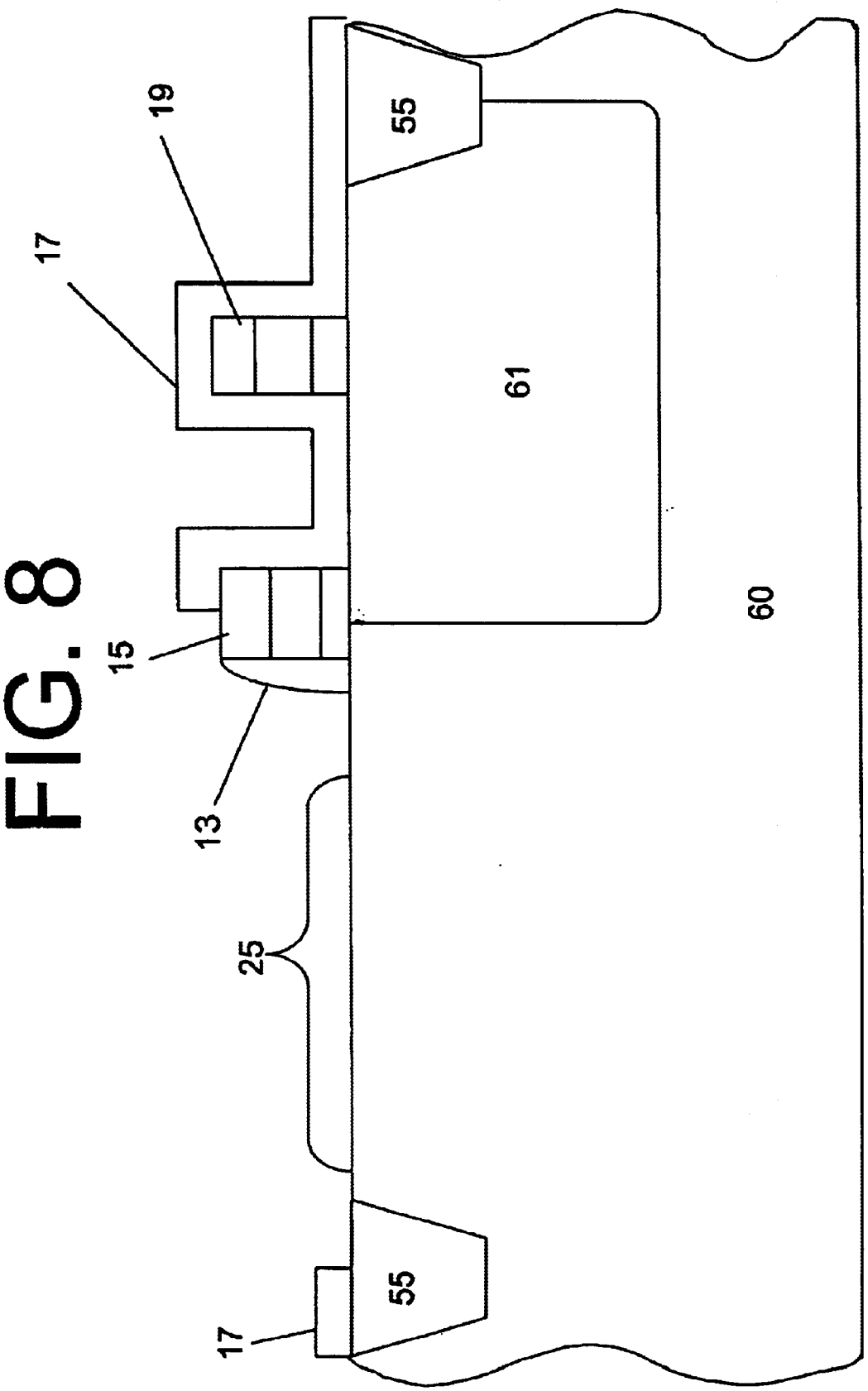
FIG. 8 shows a stage of processing subsequent to that shown in FIG. 7.
Figure 9:
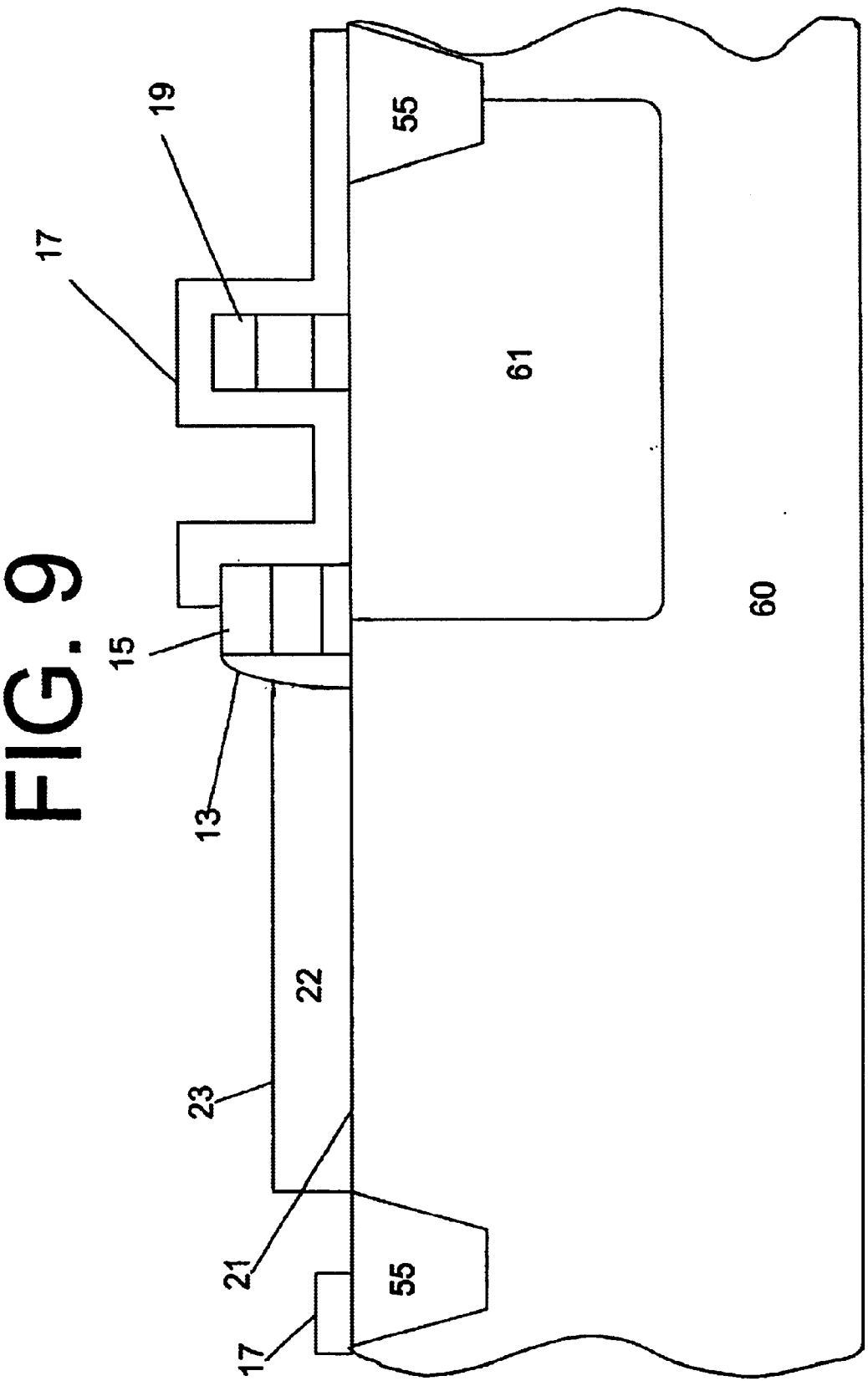
FIG. 9 shows a stage of processing subsequent to that shown in FIG. 8.
Figure 10:
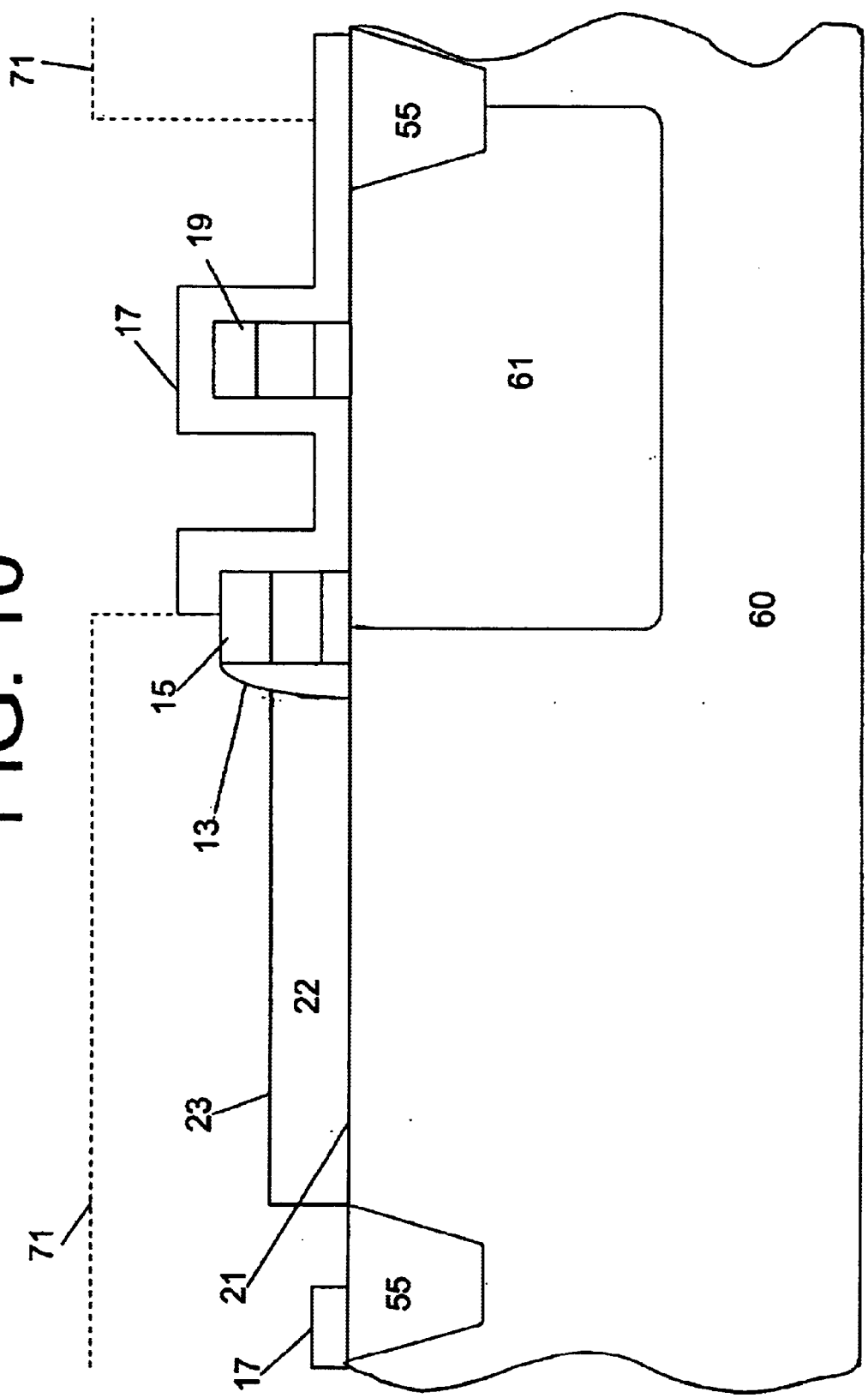
FIG. 10 shows a stage of processing subsequent to that shown in FIG. 9.
Figure 11:
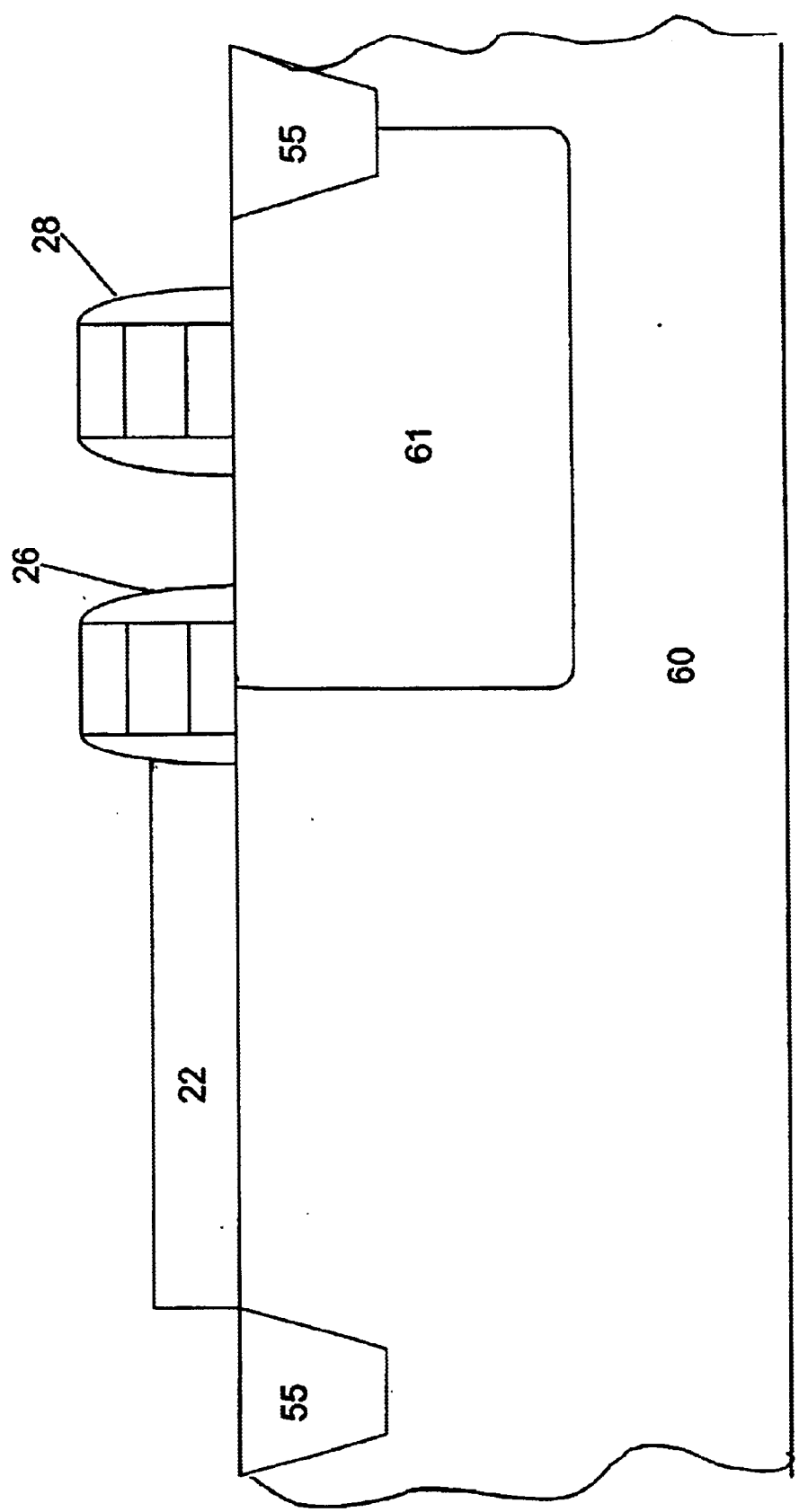
FIG. 11 shows a stage of processing subsequent to that shown in FIG. 10.

A sidewall 13 is formed in area 11 by a $SiO_2$ dry etching. A photo resist erase step is performed after the sidewall 13 is formed and photodiode area 25 is opened. FIG. 8 shows the formed $SiO_2$ sidewall 13 located in the area 11 (FIG. 7). A selective epitaxial silicon growth layer of around 1000 Å thickness is grown on area 25 where the photodiode will be formed. Formed epitaxial region 22 is depicted in FIG. 9. Region 22 is situated above the substrate 60 surface 21 at an elevated level, thus creating a second surface 23. A second photolithography step is performed to open the transistors and the transfer gate side which docs not yet have a sidewall. A photo resist layer 71, shown as a dotted line in FIG. 10, is formed over the wafer with the exception of the areas where sidewalls will be formed. Sidewalls, shown in FIG. 11, are then added to the remaining gate stacks by a $SiO_2$ dry etching step.

Figure 12:
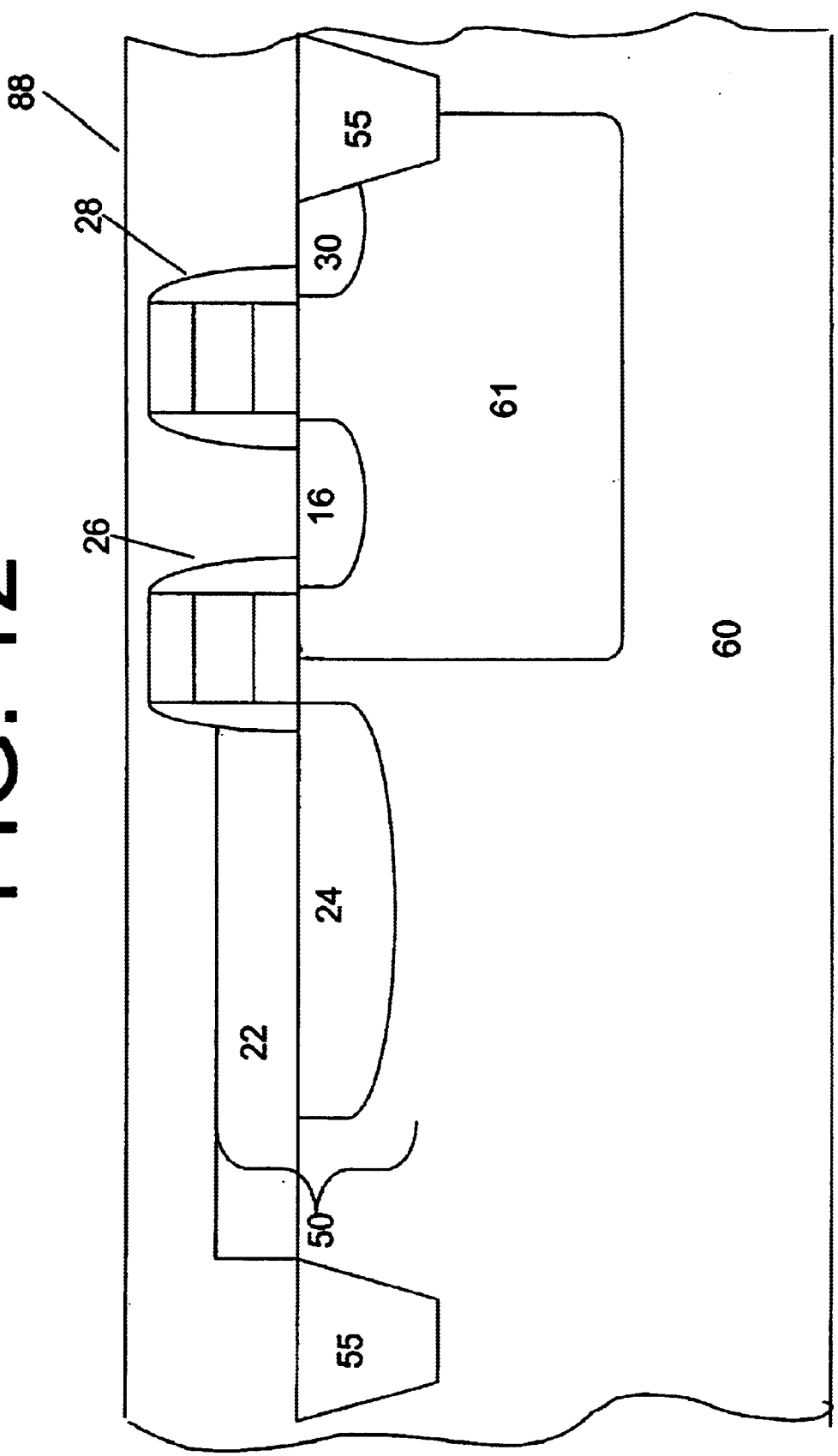
FIG. 12 shows a stage of processing subsequent to that shown in FIG. 11.

Formed floating diffusion region 16 and source/drain region 30 are depicted in FIG. 12. The doped regions 16, 30 are formed in the p-well 61 and are doped to an n-type conductivity in this embodiment. For exemplary purposes, regions 16, 30 are n+ doped and may be formed by applying a mask to the substrate and doping the regions 16, 30 by ion implantation. FIG. 12 also shows p-type implantation of region 22. Optimal doping concentrations for the p-type layer 22 formed by the growth of a selective silicon epitaxial layer can be achieved by in situ doping or ion implantation doping methods known in the art. The n-type region 24 is also implanted by any methods known in the art.

The pixel sensor cell is essentially complete at this stage, and conventional processing methods may be used to form insulating, shielding, and metallization layers to connect gate lines and other connections to the pixel sensor cells. For example, the entire surface may be covered with a passivation layer 88 of, for example, silicon dioxide, BSG, PSG, or BPSG, which is CMP planarized and etched to provide contact holes, which are then metallized to provide contacts. Conventional layers of conductors and insulators may also be used to interconnect the structures and to connect the pixel to peripheral circuitry.

Figure 13:
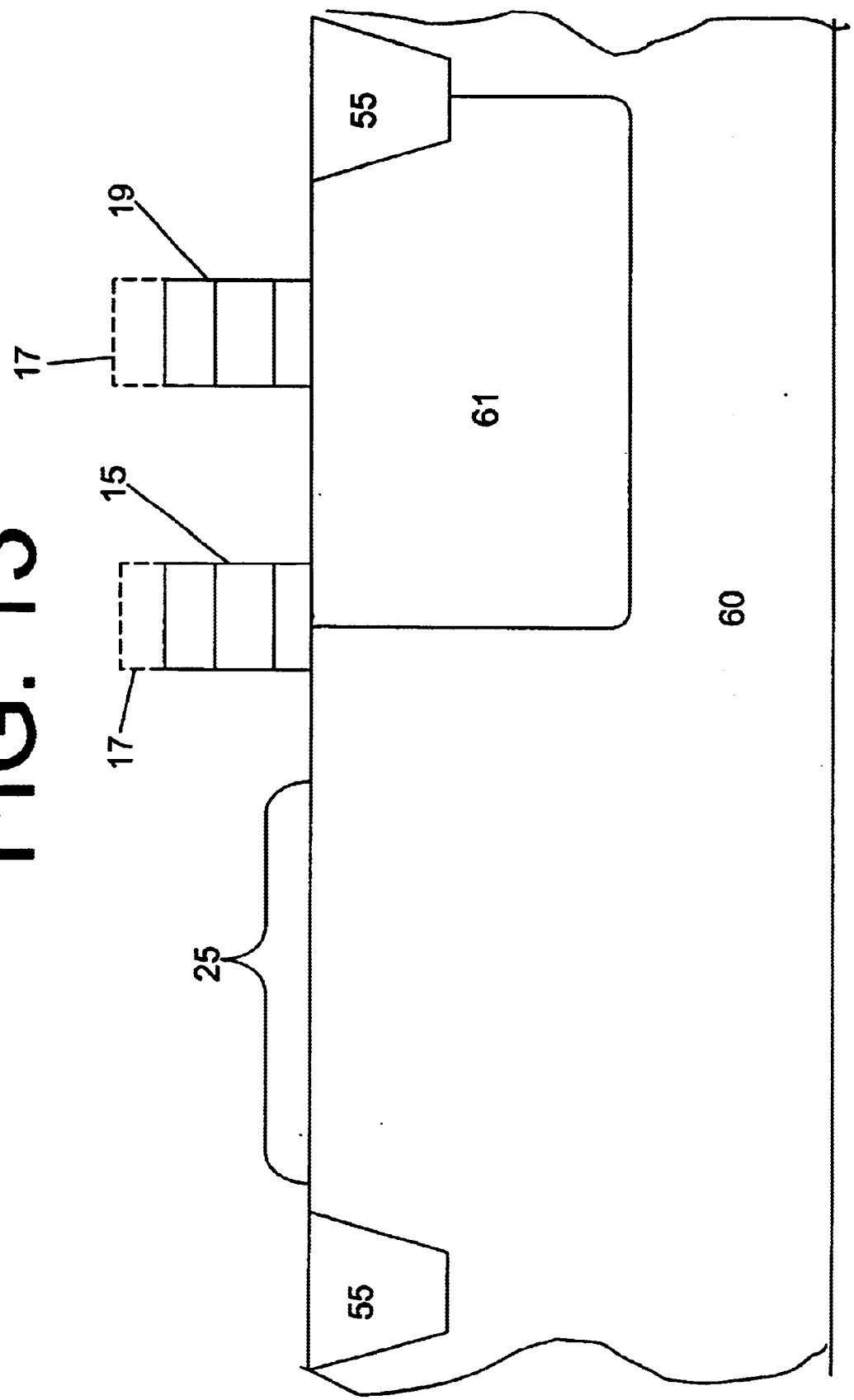
FIG. 13 shows a cross-sectional view of an exemplary p-n-p photodiode having an elevated photodiode and source/drain regions according to another embodiment of the invention during a stage of processing.
Figure 14:
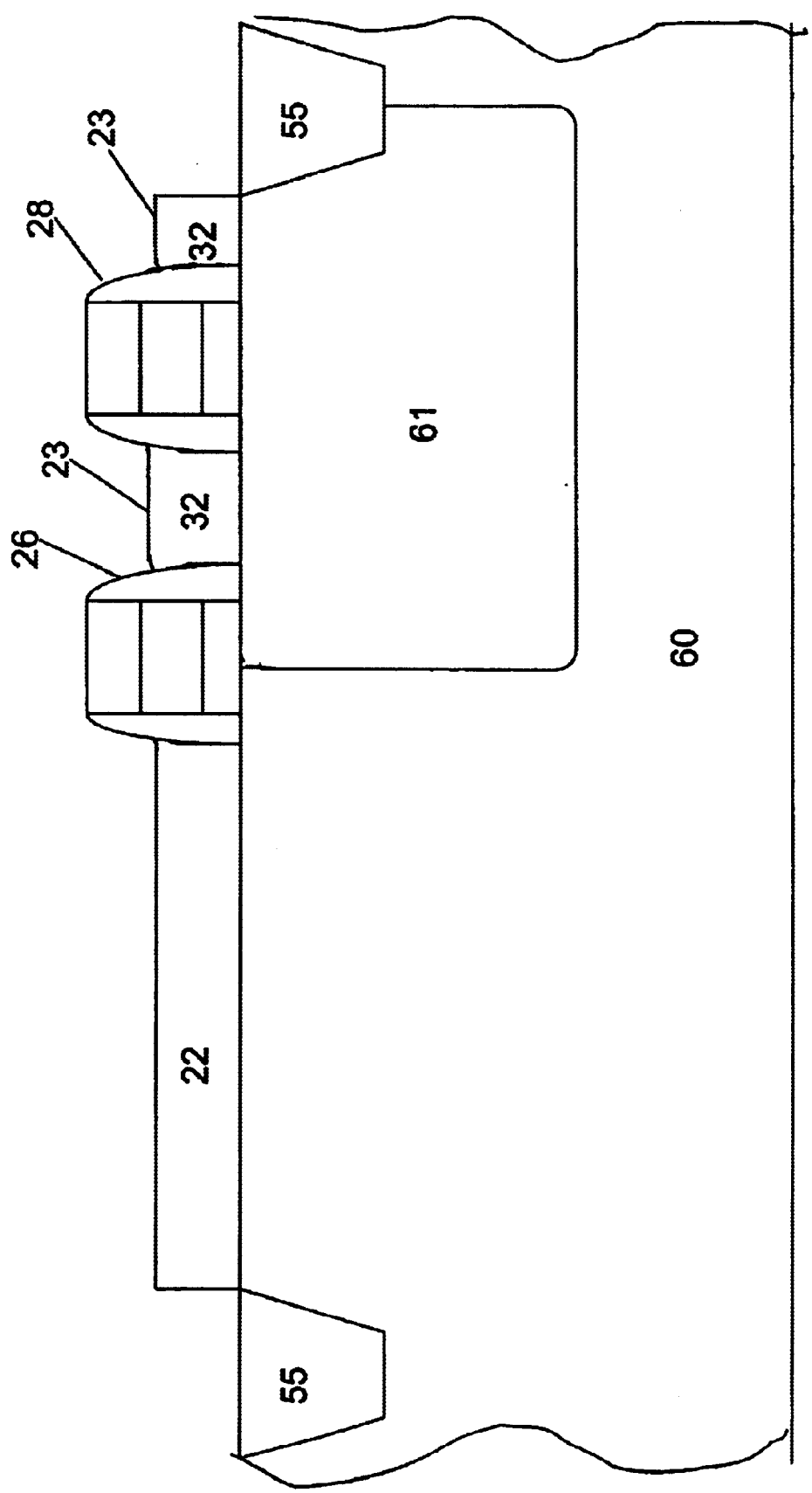
FIG. 14 shows a stage of processing subsequent to that shown in FIG. 13.
Figure 15:
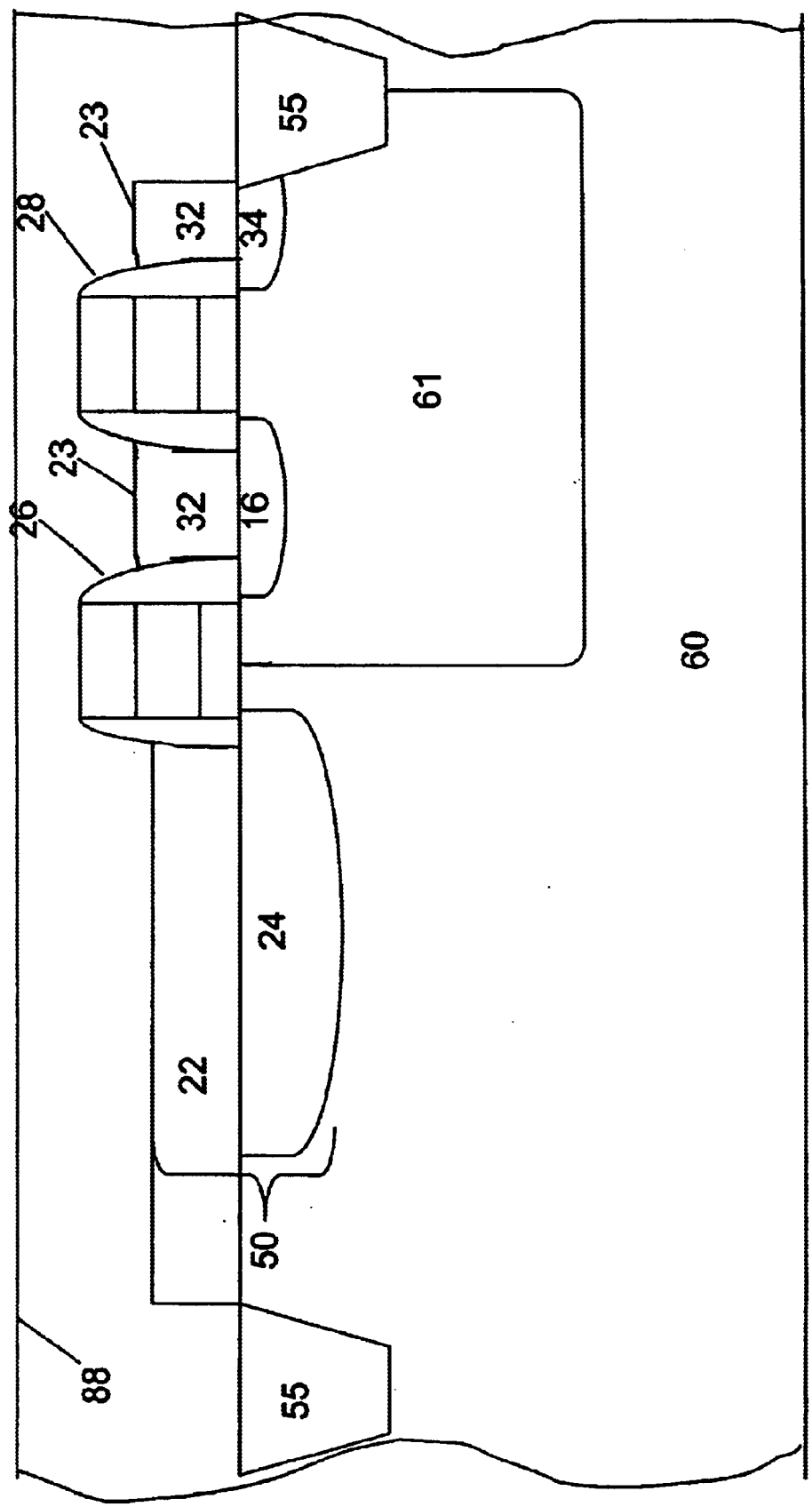
FIG. 15 shows a stage of processing subsequent to that shown in FIG. 14.

FIGS. 13 through 15 show a second exemplary embodiment of the invention. The process for forming the embodiment shown in FIG. 15 is similar to the process shown in FIGS. 4–12, with the following exceptions. FIG. 13 shows silicon dioxide blocking layer 17 over the gate stacks only. FIG. 14 depicts sidewalls formed for transistors 26 and 28 and the epitaxial layer 22 grown on area 25, as described above. In this embodiment however, the epitaxial layer is also grown over the source/drain regions, shown as epitaxial layer 32, in addition to area 25. Therefore, source/drain regions 32 are also elevated to a second surface level 23. The elevated source/drain regions 32 have a shallower junction depth into p-well 61 and thus decreased leakage current. FIG. 15 shows the pixel sensor cell after selectively epitaxially growing layers 22 and 32, layer 22 is doped p-type and layer 32 is doped n-type, preferably n+ doped. Region 24 is also implanted and doped n-type as described above. Source/drain regions 16 and 34, formed in substrate 60, are n-LDD (n-type lightly doped drain) regions in this embodiment.

Figure 16:
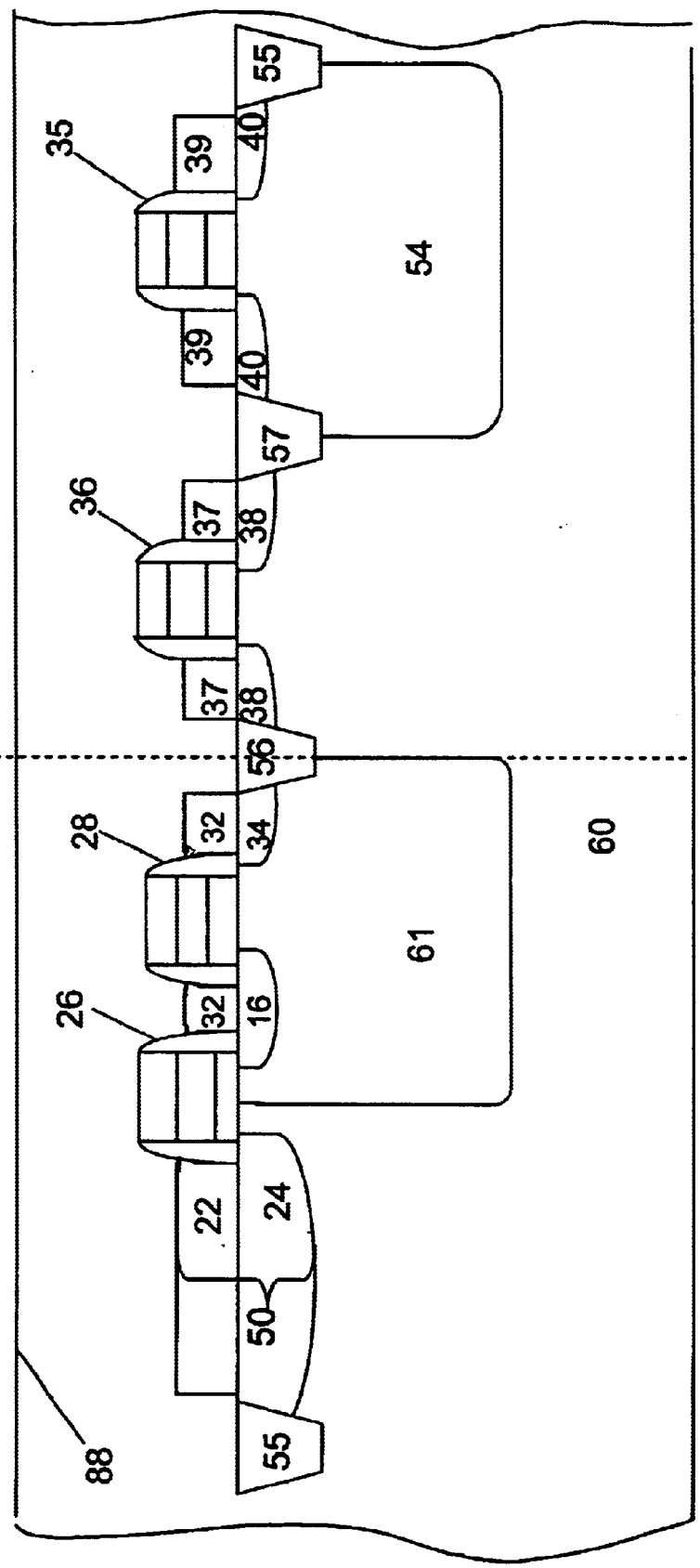
FIG. 16 is a cross-sectional view of another embodiment of the invention which includes a PMOS and NMOS transistor.

FIG. 16 shows another exemplary embodiment of the invention, which includes peripheral transistors, NMOS transistor 36 and PMOS transistor 35 as well as a pixel cell. The NMOS transistor 36 and PMOS transistor 35 are separated by an isolation region 57. The NMOS transistor 36 has epitaxial n-type source/drain regions 37 on each side of a gate. The n-type source/drain regions 38 arc n-LDD (n-type lightly doped drain) within the substrate 60, under the surface of the elevated portion 37, which is also n-type. The PMOS transistor 35 is situated over an n-wall 54 and has elevated epitaxial p-type source/drain regions 39 on both sides of its gate. The p-type regions 40 under the surface of the substrate 60 are p-LDD (p-type lightly doped drain) under the surface of the elevated portion 39. The elevated p-type source/drain regions 39 minimize boron diffusion into the channel region and minimize gate leakage current in a short channel length device.

As discussed above, the pixel sensor cell includes photodiode 50, shown as a p-type region 22 and n-type region 24 over p-type substrate 60. Source/drain regions 32, 34, floating diffusion region 16 and transfer transistor with associated gate 26 and reset transistor with associated gate 28 are also included in this embodiment. The pixel sensor cell area, shown on the left side of the dotted line, is separated from the peripheral transistors 35, 36 by an isolation region 56.

The process for forming the embodiment shown in FIG. 16 is similar to the process shown in FIGS. 4–12, with the following exceptions. An n-well 54 is formed in the current embodiment. There is also an isolation region 57, shown centrally located between the NMOS 36 and PMOS 35 transistors in FIG. 16. In addition, the regions 37, 38 are n-type doped while the regions 39, 40 are p-type doped in the embodiment of FIG. 16. It should be understood that while FIG. 16 illustrates a pixel cell adjacent to the periphery circuitry containing NMOS and PMOS transistors, that this layout is merely exemplary, and that the periphery circuitry may be formed of all NMOS, all PMOS, or combinations of NMOS and PMOS transistors. Also, the spatial arrangement of the pixel and the periphery transistors is merely exemplary.

Figure 1:
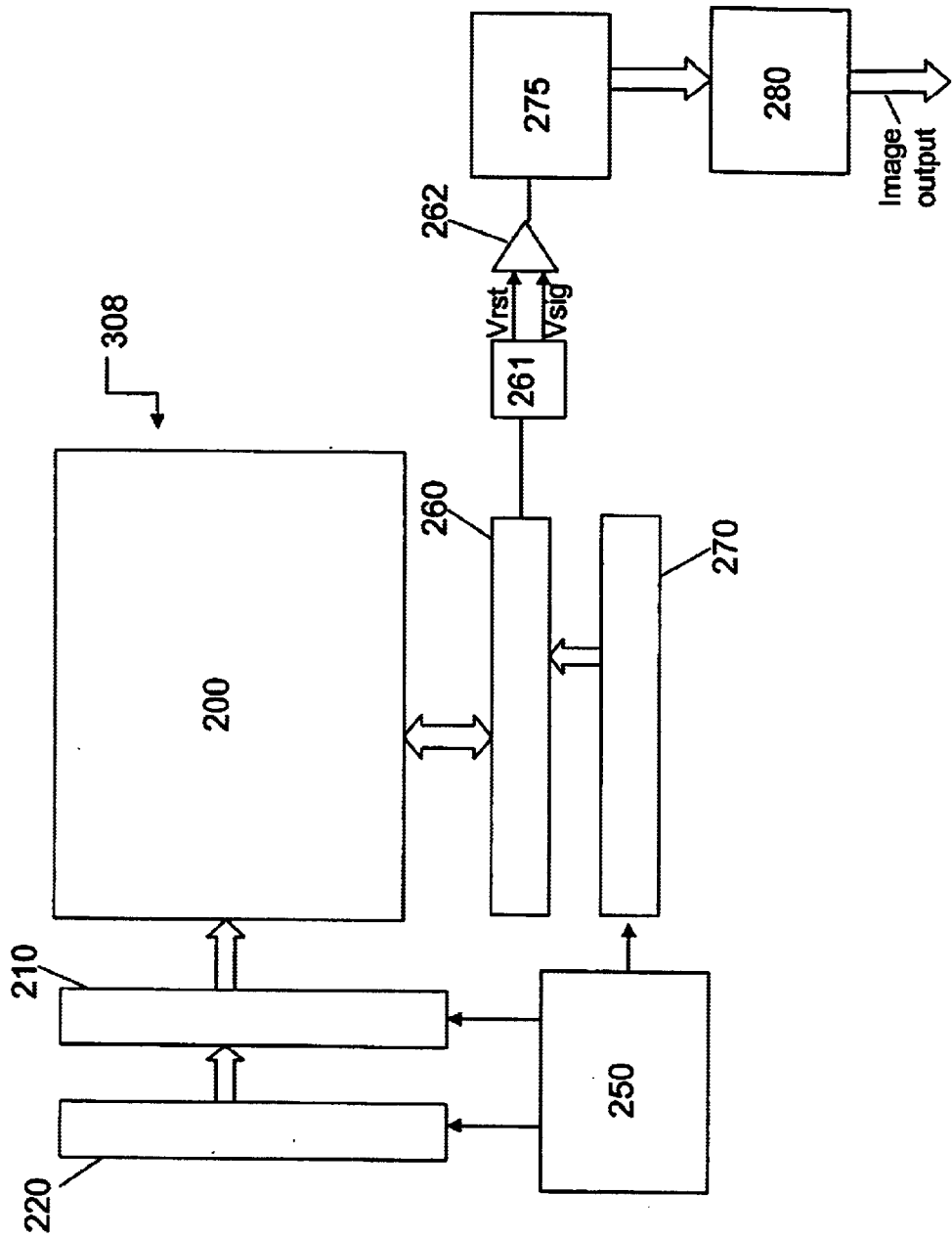
FIG. 1 is a block diagram of a conventional CMOS imager chip having a pixel array.
Figure 2:
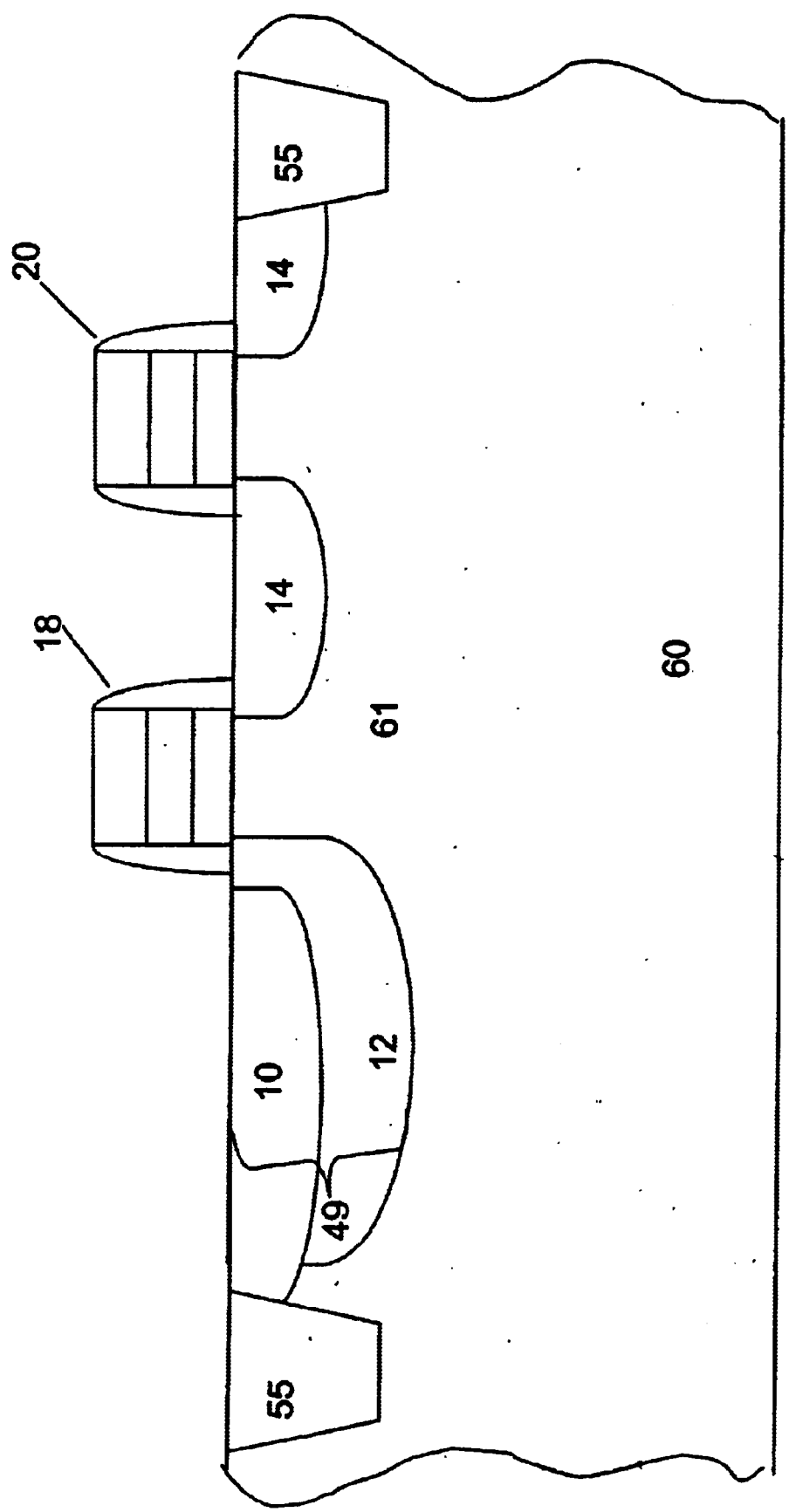
FIG. 2 is a cross-sectional view of a conventional p-n-p photodiode.
Figure 17:
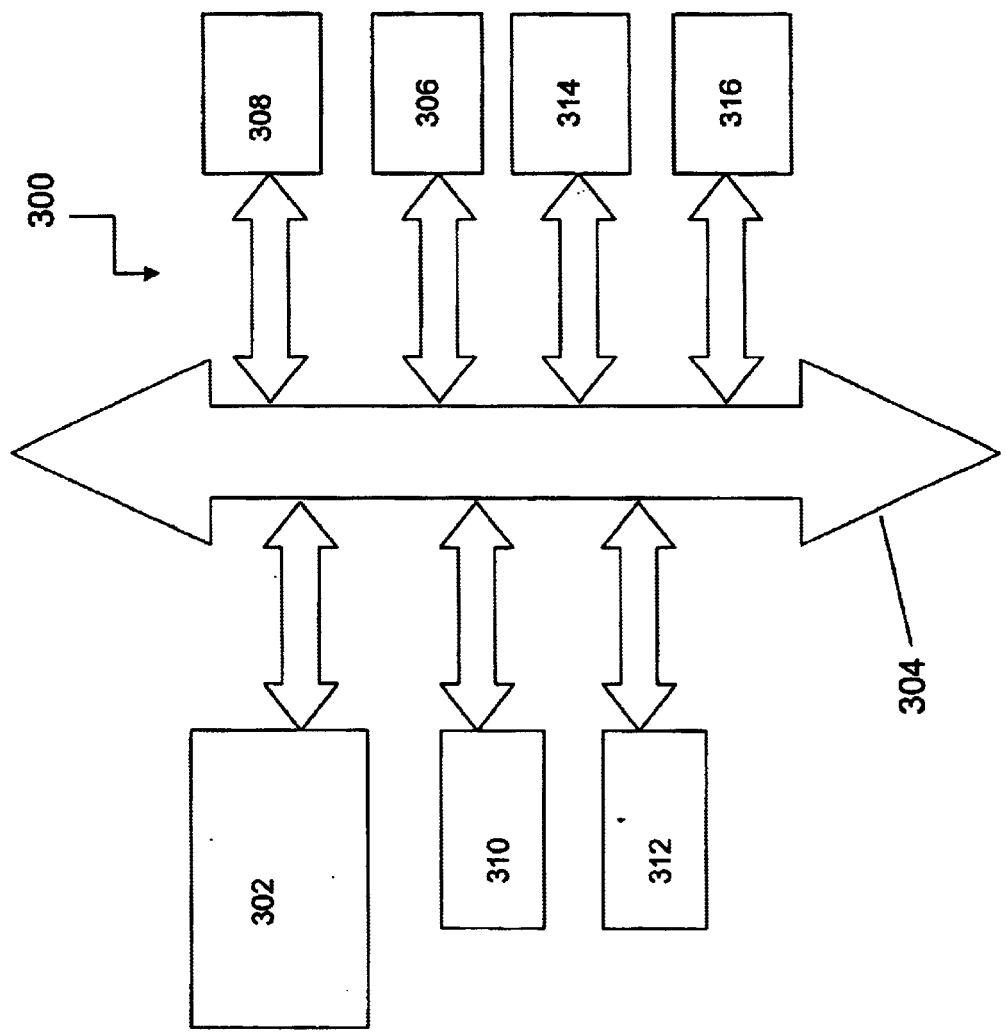
FIG. 17 is a schematic diagram of a processing system employing a CMOS imager having elevated photodiodes constructed in accordance with the present invention.

FIG. 17 shows a processor system 300, which includes an imager device 308 (FIG. 1) constructed in accordance with an embodiment of the invention, that is, the imager device 308 uses a pixel array having pixels constructed in accordance with the various embodiments of the invention. The imager device 308 may receive control or other data from system 300. System 300 includes a processor 302 having a central processing unit (CPU) that communicates with various devices over a bus 304. Some of the devices connected to the bus 304 provide communication into and out of the system 300; an input/output (I/O) device 306 and imager device 308 are such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be constructed as shown in FIG. 1 with the pixel array 200 having the characteristic of the invention as described above in connection with FIGS. 3–16. The imager device 308 may, in turn, be coupled to processor 302 for image processing, or other image handling operations.

The process and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A pixel sensor cell comprising:
   a substrate having a first surface level;
   a photoconversion device comprising a first doped region of a first conductivity type, said first doped region being located over said first surface level, wherein said first doped region is located at a second elevated surface level and a second doped region of a second conductivity type, said second doped region being located beneath said first surface level and beneath said first doped region; and
   a transistor having a gate which is located adjacent to said first and second doped region and a source/drain region having a surface located at approximately a same level as a surface of said second doped region.

2. The pixel sensor cell of claim 1 wherein said transistor is a transfer transistor.

3. The pixel sensor cell of claim 2 wherein said second doped region acts as a source for said transfer transistor.

4. The pixel sensor cell of claim 1 wherein said transistor is a reset transistor.

5. The pixel sensor cell of claim 1 wherein said first conductivity type is p-type.

6. The pixel sensor cell of claim 1 wherein said pixel sensor cell is a p-n-p photodiode.

7. A processing system comprising:
   a processor; and
   an imager coupled to said processor, said imager comprising:
   a substrate having a first surface level;
   a photoconversion device within said substrate for accumulating photogenerated charge, said photoconversion device having a first doped region of a first conductivity type, said first doped region being located over said first surface level, wherein said first doped region is located at a second elevated surface level and a second doped region of a second conductivity type, said second doped region being located beneath said first surface level and beneath said first doped region;
   a transistor having a gate which is located adjacent to said first and second doped region and a source/drain region having a surface located at approximately a same level as a surface of said second doped region; and
   a readout circuit comprising at least an output transistor formed on said substrate.

8. The system of claim 7 wherein said transistor is a transfer transistor.

9. The system of claim 8 wherein said second doped region acts as a source for said transfer transistor.

10. The system of claim 7 wherein said transistor is a reset transistor.

11. The system of claim 7 wherein said first conductivity type is p-type.

12. The system of claim 7 wherein said imager is a CMOS imager.

13. The system of claim 7 wherein said imager is a CCD imager.

14. An imager comprising:
   a doped layer formed in a substrate having a first surface level;
   an array of pixel sensor cells formed in said doped layer, wherein each pixel sensor cell has a photoconversion device;
   said photoconversion device located within said substrate and said photoconversion device having a first doped region of a first conductivity type, said first doped region being located over said first surface level, wherein said first doped region is located at a second elevated surface level and a second doped region of a second conductivity type, said second doped region being located beneath said first surface level and beneath said first doped region;
   a transistor having a gate which is located adjacent to said first and second doped region and a source/drain region having a surface located at approximately a same level as a surface of said second doped region;
   peripheral transistors formed in said substrate; and
   signal processing circuitry formed in said substrate and electrically connected to the array for receiving and processing signals representing an image output by the array and for providing output data representing said image.

15. The imager of claim 14 wherein said transistor is a transfer transistor.

16. The imager of claim 15 wherein said second doped region acts as a source for said transfer transistor.

17. The imager of claim 14 wherein said transistor is a reset transistor.

18. The imager of claim 14 wherein said first conductivity type is p-type.

19. The imager of claim 14 wherein said at least one peripheral transistor is a PMOS transistor.

20. The imager of claim 14 wherein said at least one peripheral transistor is a NMOS transistor.

21. The imager of claim 14 wherein said imager is a CMOS imager.

22. A method of forming a pixel sensor cell comprising:
   forming a blocking layer on a first substrate layer and over at least one transistor gate;
   performing photolithography to form an opening a region where said photoconversion device will be formed;
   growing an epitaxial layer of silicon in said opening;
   etching said blocking layer to form sidewalls on said transistor gate;
   forming at least a first portion of a photoconversion device in said epitaxial layer above said first substrate layer; and
   forming a second portion of said photoconversion device in an upper region of said first substrate layer.

23. The method according to claim 22 wherein said blocking layer is silicon dioxide.

24. The method according to claim 23 wherein said first conductivity type is p-type.

25. The method according to claim 23 wherein said epitaxial layer over said region where said photoconversion device will be formed has a thickness of about 1000 Å.

* * * * *

UNITED STATES PATENT AND TRADEMARK OFFICE
CERTIFICATE OF CORRECTION

PATENT NO. : 6,847,051 B2
DATED : January 25, 2005
INVENTOR(S) : Sungkwon C. Hong It is certified that error appears in the above-identified patent and that said Letters Patent is hereby corrected as shown below:

<u>Column 2,</u>
Line 11, "die" should read -- the --;

<u>Column 5,</u>
Line 25, "aid" should read -- and --.

Signed and Sealed this

Fifth Day of July, 2005

JON W. DUDAS
*Director of the United States Patent and Trademark Office*